(12) United States Patent
Sakaguchi et al.

(10) Patent No.: US 10,655,220 B2
(45) Date of Patent: May 19, 2020

(54) GAS CONTROL SYSTEM, DEPOSITION APPARATUS INCLUDING GAS CONTROL SYSTEM, AND PROGRAM AND GAS CONTROL METHOD USED FOR GAS CONTROL SYSTEM

(71) Applicant: HORIBA STEC, Co., Ltd., Kyoto-shi, Kyoto (JP)

(72) Inventors: Yuhei Sakaguchi, Kyoto (JP); Toru Shimizu, Kyoto (JP); Masakazu Minami, Kyoto (JP); Daisuke Hayashi, Kyoto (JP)

(73) Assignee: HORIBA STEC, Co., Ltd., Kyoto-shi, Kyoto (JP)

( * ) Notice: Subject to any disclaimer, the term of this patent is extended or adjusted under 35 U.S.C. 154(b) by 52 days.

(21) Appl. No.: 15/911,650

(22) Filed: Mar. 5, 2018

(65) Prior Publication Data

US 2018/0258530 A1 Sep. 13, 2018

(30) Foreign Application Priority Data

Mar. 10, 2017 (JP) ................................. 2017-046224

(51) Int. Cl.
*G05D 11/13* (2006.01)
*C23C 16/455* (2006.01)
*C23C 16/448* (2006.01)

(52) U.S. Cl.
CPC .... *C23C 16/45523* (2013.01); *C23C 16/4482* (2013.01); *C23C 16/45502* (2013.01); *C23C 16/45512* (2013.01); *C23C 16/45557* (2013.01); *C23C 16/45561* (2013.01); *G05D 11/132* (2013.01); *G05D 11/138* (2013.01); *Y10T 137/2499* (2015.04); *Y10T 137/2509* (2015.04)

(58) Field of Classification Search
CPC ................ G05D 11/135; G05D 11/138; Y10T 137/2499; Y10T 137/2509
See application file for complete search history.

(56) References Cited

U.S. PATENT DOCUMENTS 4,262,686 A * 4/1981 Heim .................... A61M 16/12
137/101.19
6,752,166 B2 * 6/2004 Lull ..................... G05D 7/0664
118/715

(Continued)

FOREIGN PATENT DOCUMENTS

JP 2006222133 A 8/2006

*Primary Examiner* — Kevin F Murphy
(74) *Attorney, Agent, or Firm* — Alleman Hall Creasman & Tuttle LLP

(57) ABSTRACT

The present invention makes it easy to control the amount of material gas led out of a tank. Accordingly, carrier gas is introduced into a tank containing a material and together with the carrier gas, from the tank, material gas produced by vaporization of the material is led out. A control part controls the flow rate of the carrier gas so that a concentration index value obtained by measuring mixed gas led out of the tank and indicating the concentration of the material gas in the mixed gas comes close to a predetermined target concentration index value. In addition, the control part controls the flow rate of the carrier gas to change at a predetermined change rate, and then controls the flow rate of the carrier gas on the basis of the deviation between the concentration index value and the target concentration index value.

19 Claims, 5 Drawing Sheets

(56) References Cited

U.S. PATENT DOCUMENTS

| | | | | |
|---|---|---|---|---|
| 7,438,079 B2* | 10/2008 | Cohen | ............... | B01F 3/028 |
| | | | | 137/3 |
| 8,459,290 B2* | 6/2013 | Minami | ............... | G05D 11/132 |
| | | | | 118/689 |
| 10,245,608 B2* | 4/2019 | Dufault | ............... | B05B 9/04 |
| 2004/0007180 A1* | 1/2004 | Yamasaki | ............... | C23C 16/16 |
| | | | | 118/715 |
| 2015/0173647 A1* | 6/2015 | Orr | ............... | A61M 16/161 |
| | | | | 434/262 |
| 2016/0047047 A1* | 2/2016 | Moroi | ............... | C23C 16/52 |
| | | | | 118/712 |

* cited by examiner

GAS CONTROL SYSTEM, DEPOSITION APPARATUS INCLUDING GAS CONTROL SYSTEM, AND PROGRAM AND GAS CONTROL METHOD USED FOR GAS CONTROL SYSTEM

TECHNICAL FIELD

The present invention relates to a gas control system, a deposition apparatus including the gas control system, and a program and gas control method used for the gas control system.

BACKGROUND ART

As a gas control system adapted to transport material gas used for deposition treatment in a semiconductor manufacturing process, as disclosed in Patent Literature 1, there is a gas control system adapted to introduce carrier gas into a tank containing a material, lead out material gas produced by vaporization of the material together with the carrier gas from the tank as mixed gas, measure the concentration of the material gas included in the mixed gas, and perform PID control of the flow rate of the carrier gas so as to bring the measured concentration close to a predetermined target concentration.

However, in the conventional gas control system, the tank before operation is in a state of being filled with the material gas of high concentration produced by vaporization in advance, and therefore when the mixed gas including the high concentration material gas is led out of the tank at once just after the operation, the concentration of the material gas included in the mixed gas momentarily increases. Also, when bringing the measured concentration close to the target concentration using the PID control, an action to increase the flow rate of the carrier gas at once is performed at the start of the control because of the time delay in concentration change. These phenomena cause the problem of occurrence of overshoot greatly exceeding the target concentration. Further, the concentration of the material gas produced in the tank by the vaporization in advance is varied by multiple factors such as material factors including the nature, amount, and so on of the material, apparatus factors including the inside diameter of each pipe member, the capacity of the tank, and the like, and external factors including temperature and the like. This causes the problem that when the material gas whose concentration is varied by the multiple factors is led out of the tank at once in the initial stage where the carrier gas is introduced, a change in the concentration of the material gas does not exhibit reproducibility. Further, due to these problems, the total amount of the material gas to be led out of the tank is difficult to control using only the PID control used for the conventional gas control system.

CITATION LIST

Patent Literatures

Patent Literature 1: Japanese Unexamined Patent Application Publication No. 2006-222133

SUMMARY OF INVENTION

Technical Problem

Therefore, a main object of the present invention is to, by preventing high concentration material gas produced in a tank by vaporization of a material in advance from being led out at once just after operation, suppress overshoot and, to some extent, provide reproducibility to a change in the concentration of the material gas in mixed gas led out of the tank after the operation, thus making it easy to control the total amount of the material gas to be led out of the tank.

Solution to Problem

That is, a gas control system according to the present invention is one adapted to introduce carrier gas into a tank containing a material and together with the carrier gas, from the tank, lead out material gas produced by vaporization of the material, and the gas control system includes a control part that controls the flow rate of the carrier gas so that a concentration index value obtained by measuring mixed gas led out of the tank and directly or indirectly indicating the concentration of the material gas in the mixed gas comes close to a predetermined target concentration index value. In addition, the control part performs first control that controls the flow rate of the carrier gas to change at a predetermined change rate, and then performs second control that controls the flow rate of the carrier gas on the basis of the deviation between the concentration index value and the target concentration index value.

In such a gas control system, by controlling the flow rate of the carrier gas at the predetermined change rate for a while after starting to introduce the carrier gas into the tank, the material gas of high concentration produced in the tank by vaporization in advance before introducing the carrier gas into the tank can be prevented from being led out at once just after introducing the carrier gas into the tank, and consequently the degree of overshoot can be reduced. Further, reproducibility can be provided to a change in the concentration of the material gas in the mixed gas led out of the tank just after starting to introduce the carrier gas into the tank. In addition, these effects make it easy to control the total amount of the material gas to be led out of the tank.

Also, in the gas control system, the control part may be one configured to switch to the second control before the concentration index value reaches the target concentration index value.

In such a configuration, even after switching from the first control to the second control, there is a certain amount of time before the concentration index value reaches the target concentration index value, and the switch from the first control to the second control can be smoothly made, thus consequently making it possible to further reduce the degree of overshoot.

In addition, specific configurations of the first control include one in which the control part sets the predetermined change rate with reference to an initial change rate of the concentration index value of the mixed gas led out of the tank just after starting to introduce the carrier gas. Also, the specific configurations include one in which the gas control system further includes an initial change rate data storage part that preliminarily stores initial change rate data obtained by measuring the initial change rate under various conditions, and the control part sets the predetermined change rate with reference to the initial change rate data.

In such configurations, a case where as the predetermined change rate, an extremely low value is set to delay a response too much or a case where as the predetermined change rate, an extremely high value is set to promote the occurrence of overshoot can be prevented.

Further, specific configurations of the second control include one in which the control part shifts a change rate of the flow rate of the carrier gas by a predetermined value when the concentration index value switches from any one of a first state of being within a predetermined target concentration index value range including the target concentration index value and a second state of being outside the target index value range to the other. More specific configurations include one in which the control part shifts the change rate of the flow rate of the carrier gas so as to increase the change rate by a predetermined value when switching from the first state to the second stage, and when switching from the second state to the first state, shifts the change rate of the flow rate of the carrier gas so as to decrease the change rate by a predetermined value. In this case, a configuration in which in any one or both of the first state and the second state of the second control, the control part controls the flow rate of the carrier gas so as to change the flow rate at a constant change rate, and a configuration in which the second control is PID control, and in the PID control as the second control, the control part sets a proportional gain to a larger value in the second state than in the first state can be cited. In such specific configurations, in the second control, the control part may control the change rate of the flow rate of the carrier gas in the first state to zero.

In such configurations, when varying the concentration index value around the target concentration index value, if the concentration index value significantly gets away from the target concentration index value, the control part controls the concentration index value to greatly change and come close to the target concentration index value, whereas if the concentration index value does not get away from the target concentration index value so much, a change in the concentration index value is suppressed. In doing so, a variation in the concentration index value with respect to the target concentration index value can be stabilized.

In any of the above-described gas control systems, the control part may be one adapted to, between the first control and the second control, perform third control that controls a change rate of the flow rate of the carrier gas to zero. Also, the control part may be one adapted to, between the first control and the second control, perform fourth control that performs PID control of the flow rate of the carrier gas on the basis of the deviation between the concentration index value and the target concentration index value, and in this case, the control part may set the proportional gain of PID control as the second control to a smaller value than the PID control as the fourth control.

In such gas control systems, the third control interposes between the first control and the second control, and the third control allows an increase rate of the concentration index value to be decreased toward the target concentration index value. As a result, overshoot where the concentration index value considerably exceeds the target concentration index value is suppressed and the switch from the first control to the second control can be smoothly made.

Also, the gas control system according to the present invention is one adapted to introduce carrier gas into a tank containing a material, and by together with the carrier gas, from the tank, leading out material gas produced by vaporization of the material, intermittently lead out a predetermined amount of the material gas from the tank, and the gas control system includes: a control part that performs PID control of the flow rate of the carrier gas so that a concentration index value obtained by measuring mixed gas led out of the tank and directly or indirectly indicating the concentration of the material gas in the mixed gas comes close to a predetermined target concentration index value; and a calibration data storage part that as calibration data, stores a temporal change in the concentration index value obtained by PID control performed by the control part on the predetermined amount of the material gas led out of the tank for the first time. In addition, when performing the PID control of the predetermined amount of the material gas led out of the tank for the second time or thereafter, the control part refers to the calibration data to set a controllable range that defines the upper and lower limits of an operation amount of the flow rate of the carrier gas in the PID control.

In such a gas control system, by acquiring the calibration data in the first lead-out step, and using the calibration data for control in the second or subsequent lead-out step, overshoot in the second or subsequent lead-out step can be considerably reduced, thus making it easy to control the total amount of the material gas to be led out of the tank in the second or subsequent lead-out step.

Further, the gas control system according to the present invention is one adapted to introduce carrier gas into a tank containing a material and together with the carrier gas, from the tank, lead out material gas produced by vaporization of the material, and the gas control system includes a control part that performs feedback control of the flow rate of the carrier gas on the basis of the deviation between a concentration index value obtained by measuring mixed gas led out of the tank and directly or indirectly indicating the concentration of the material gas in the mixed gas and a predetermined target concentration index value so that the concentration index value comes close to the target concentration index value. In addition, the control part controls the total amount of the material gas led out within a lead-out time from just after starting to introduce the carrier gas into the tank to stopping introducing the carrier gas to a predetermined target total amount. In addition, in this gas control system, the control part may be one adapted to successively calculate the flow rate of the material gas on the basis of the concentration of the material gas in the mixed gas and the flow rate of the carrier gas from just after starting to introducing the carrier gas into the tank, and successively reset the lead-out time with reference to the total passing amount of the material gas that is obtained by adding up the successively calculated flow rates of the material gas and led out of the tank.

In such a gas control system, the total amount of the material gas to be led out of the tank can be accurately controlled.

Also, in any of the above-described gas control systems, the mixed gas may be gas produced by further adding diluent gas to the material and carrier gases led out of the tank, and the control part may be one adapted to control the flow rate of the carrier gas and the flow rate of the diluent gas so that the total amount of the carrier gas and the diluent gas included in the mixed gas is kept constant.

Further, a deposition apparatus according to the present invention is one that supplies mixed gas to a deposition chamber through any of the above-described gas control systems.

Still further, a program according to the present invention is one used for a gas control system adapted to introduce carrier gas into a tank containing a material and together with the carrier gas, from the tank, lead out material gas produced by vaporization of the material. In addition, the program is one adapted to instruct a computer to fulfill functions of: controlling the flow rate of the carrier gas so that a concentration index value obtained by measuring mixed gas led out of the tank and directly or indirectly indicating the concentration of the material gas in the mixed gas comes close to a predetermined target concentration index value; and performing first control that controls the flow rate of the carrier gas to change at a predetermined change rate and then performing second control that controls the flow rate of the carrier gas on the basis of the deviation between the concentration index value and the target concentration index value.

Yet further, a gas control method according to the present invention is one that controls the concentration of material gas in mixed gas to be led out of a tank in a gas control system adapted to introduce carrier gas into the tank containing a material and together with the carrier gas, from the tank, lead out the material gas produced by vaporization of the material. In addition, the gas control method controls the flow rate of the carrier gas so that a concentration index value obtained by measuring the mixed gas led out of the tank and directly or indirectly indicating the concentration of the material gas in the mixed gas comes close to a predetermined target concentration index value; and performs first control that controls the flow rate of the carrier gas to change at a predetermined change rate and then performs second control that controls the flow rate of the carrier gas on the basis of the deviation between the concentration index value and the target concentration index value.

Advantageous Effects of Invention

According to the present invention configured as described above, by preventing the material gas of high concentration produced in the tank by vaporization of the material in advance from being led out at once just after operation, overshoot can be suppressed and reproducibility can be provided to some extent to a change in the concentration of the material gas in the mixed gas led out of the tank after the operation, thus making it easy to control the total amount of the material gas to be led out of the tank.

DESCRIPTION OF EMBODIMENTS

In the following, the gas control system according to the present invention will be described with reference to the drawings.

The gas control system according to the present invention is used to stably supply material gas to, for example, a deposition apparatus used in a semiconductor manufacturing process. More specifically, the gas control system is one adapted to, together with carrier gas (inert gas such as argon), lead out material gas produced by vaporizing a low vapor pressure material (e.g., a halide material such as aluminum chloride or tungsten chloride) in a tank, and supply mixed gas produced by adding diluent gas (inert gas such as argon) to the material and carrier gases led out of the tank. Note that the low vapor pressure material may be a solid material or a liquid material. In addition, the gas control system according to the present invention can also be used for gas control other than in the semiconductor manufacturing process. Further, regarding the material, the gas control system is also applicable when using a material other than in the semiconductor manufacturing process.

First Embodiment

Figure 1:
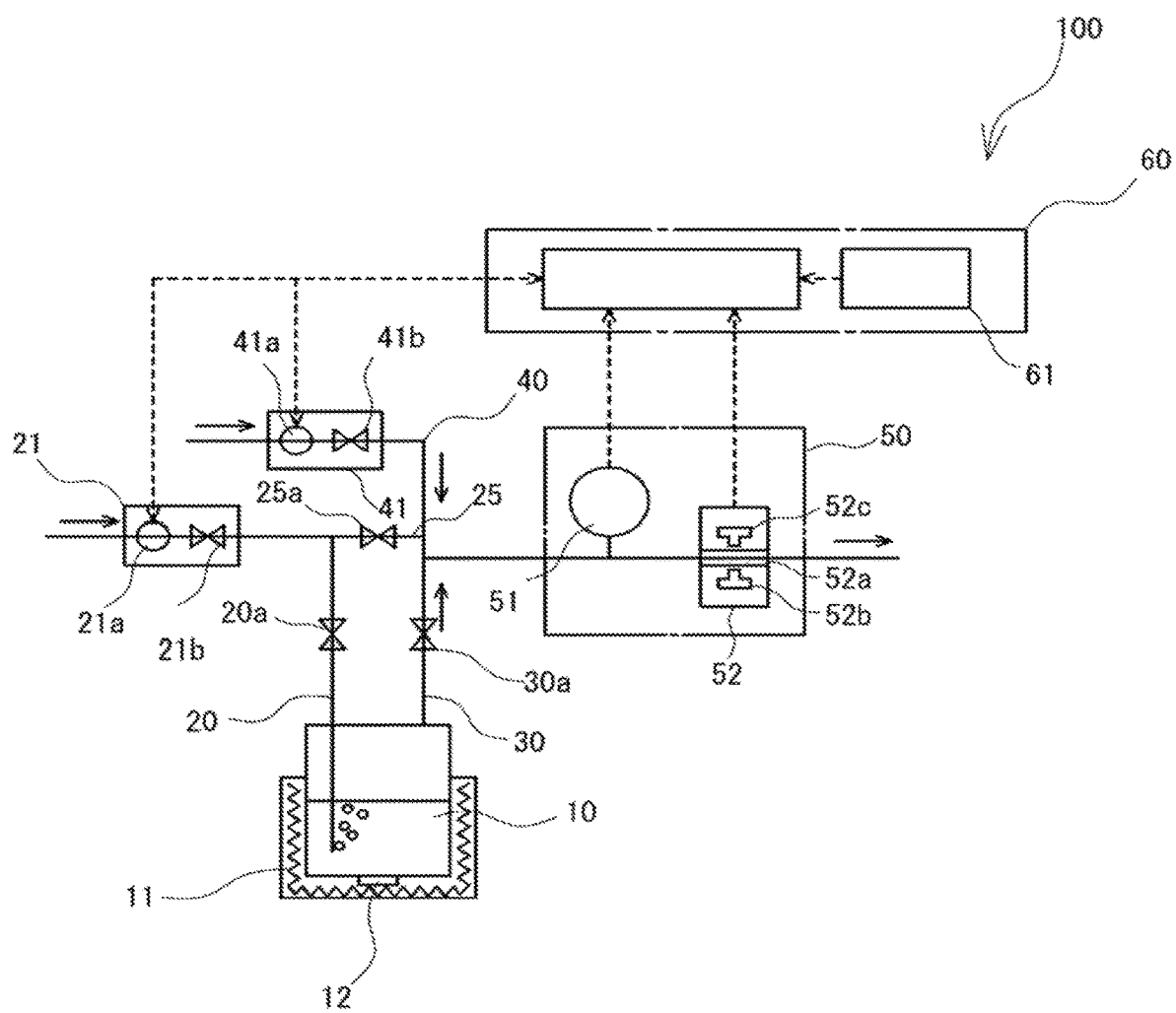
FIG. 1 is a schematic diagram illustrating a gas control system according to a first embodiment.

As illustrated in FIG. 1, a gas control system 100 according to the present embodiment includes: a tank 10 for containing a material; a carrier gas introduction path 20 for introducing carrier gas into a material space of the tank 10; a lead-out path 30 for leading out material gas and the carrier gas from a vapor phase space of the tank 10; and a diluent gas introduction path 40 for introducing diluent gas into the lead-out path 30. In addition, the carrier gas introduction path 20 and the lead-out path 30 are connected by a connecting path 25, and the carrier gas introduction path 20, the connecting path 25, and the lead-out path 30 are provided with valves 20a, 25a, and 30a, respectively. Further, the carrier gas introduction path 20 is installed with a carrier gas flow rate adjustment part 21 on the upstream side of the valve 20a, the diluent gas introduction path 40 is installed with a diluent gas flow rate adjustment part 41, and the lead-out path 30 is installed with a measurement part 50 on the downstream side of the valve 30a. Although not illustrated, the start point of the carrier gas introduction path 20 is connected to a carrier gas supply mechanism, the start point of the diluent gas introduction path 40 is connected to a diluent gas supply mechanism, and the end point of the lead-out path 30 is connected to a deposition chamber to be supplied with the mixed gas.

The tank 10 is provided with a heater 11 capable of heating the contained material and a thermometer 12 for measuring the temperature inside the tank 10, and configured such that the temperature inside the tank 10 is monitored by the thermometer 12 and controlled to a predetermined setting temperature. Note that the tank 10 may be configured such that the heater 11 and the thermometer 12 are connected to a control part 60 to control the temperature inside the tank 10.

The carrier gas flow rate adjustment part 21 is one adapted to adjust the flow rate of the carrier gas to be introduced into the tank 10, and a so-called mass flow controller (MFC). The carrier gas flow rate adjustment part 21 roughly includes: a flowmeter 21a for measuring the flow rate of the carrier gas flowing through the carrier gas introduction path 20; and a valve 21b installed on the downstream side of the flowmeter 21a. In addition, the valve 21b is adapted to adjust the flow rate of the carrier gas to be introduced into the tank 10 by adjusting its opening level.

The diluent gas flow rate adjustment part 41 is one adapted to adjust the flow rate of the diluent gas to be introduced into the lead-out path 30, and a so-called mass flow controller (MFC). The diluent gas flow rate adjustment part 41 roughly includes: a flowmeter 41a for measuring the flow rate of the diluent gas flowing through the diluent gas introduction path 40; and a valve 41b installed on the downstream side of the flowmeter 41a. In addition, the valve 41*b* is adapted to adjust the flow rate of the diluent gas to be introduced into the lead-out path 30 by adjusting its opening level.

The measurement part 50 includes: a pressure measurement device 51 and a partial pressure measurement device 52 both installed on the downstream side of a position where the diluent gas introduction path 40 is connected to the lead-out path 30. In addition, the partial pressure measurement device 52 is installed on the downstream side of the pressure measurement device 51.

The pressure measurement device 51 is a pressure sensor for measuring the pressure of the mixed gas flowing through the lead-out path 30. Also, the partial pressure measurement device 52 is a light absorption type partial pressure sensor for measuring the partial pressure of the material gas in the mixed gas flowing through the lead-out path 30. Specifically, the partial pressure measurement device 52 is configured to allow the mixed gas flowing through the lead-out path 30 to pass through a flow cell 52*a*, and be installed with a light source 52*b* on one side and a reception part 52*c* on the other hand, interposing the flow cell 52*a* between them. In addition, the partial pressure measurement device 52 is adapted to allow light emitted from the light source 52*b* to pass through the mixed gas flowing through the flow cell 52*a*, then receive the resulting light by the reception part 52*c*, and on the basis of the intensity of the light received by the reception part 52*c*, measure the partial pressure of the material gas in the mixed gas.

The control part 60 is a general-purpose or dedicated computer, and stores a predetermined program in its memory. In addition, a CPU and its peripheral devices cooperate in accordance with the program, and thereby the control part 60 fulfills a function of controlling the concentration of the material gas in the mixed gas. Specifically, the control part 60 calculates the measured concentration (concentration index value) of the material gas in the mixed gas on the basis of the pressure of the mixed gas measured by the pressure measurement device 51 and the partial pressure of the material gas in the mixed gas measured by the partial pressure measurement device 52, and controls the flow rates of the carrier gas and the diluent gas so as to bring the measured concentration close to a predetermined target concentration (target concentration index value). In addition, the control part 60 includes an input part 61 such as a touch panel capable of inputting various types of information.

Next, an operation procedure for the gas control system according to the present embodiment will be described on the basis of a flowchart illustrated in FIG. 2. Note that a graph illustrated in FIG. 3 shows a temporal change in measured concentration in Steps S2 to S12 of the flowchart illustrated in FIG. 2.

First, using the input part 61, the target concentration of the material gas in the mixed gas most suitable for deposition treatment, the upper and lower limit values of a target concentration range (target concentration index value range) including the target concentration, and the initial flow rates of the carrier gas and the diluent gas are respectively inputted to the control part 60 (Step S1).

Then, the control part 60 transmits the initial flow rate of the carrier gas to the carrier gas flow rate adjustment part 21 and thereby controls the carrier gas to flow through the carrier gas introduction path 20 at the initial flow rate. Also, the control part 60 transmits the initial flow rate of the diluent gas to the diluent gas flow rate adjustment part 41, and thereby controls the diluent gas to flow through the diluent gas introduction path 40 at the initial flow rate. As a result, the respective gases start to circulate through the gas control system 100 (Step S2). In the following steps, the control part 60 controls the flow rate of the carrier gas and the flow rate of the diluent gas so as to always keep constant the total amount of the carrier gas and the diluent gas included in the mixed gas.

After that, when the mixed gas led out of the tank 10 passes through the measurement part 50, the pressure measurement device 51 measures the pressure of the mixed gas flowing through the lead-out path 30 and also the partial pressure measurement device 52 measures the partial pressure of the material gas in the mixed gas flowing through the lead-out path 30. Then, the measured pressure and the measured partial pressure are sequentially transmitted to the control part 60.

Subsequently, the control part 60 calculates measured concentrations on the basis of measured pressures and measured partial pressures measured during a predetermined time just after starting to introduce the carrier gas into the tank 10, and on the basis of an initial change rate among measured concentrations during the predetermined time, sets a change rate (i.e., a change amount per unit time, hereinafter also referred to as a "predetermined change rate") of the flow rate of the carrier gas. After that, the control part 60 starts first control that controls the flow rate of the carrier gas to change at the predetermined change rate (Step S4). Note that the predetermined change rate may be a constant change rate or a specific increase/decrease rate.

Then, the control part 60 determines whether or not measured concentration reaches control switching concentration that has the lower limit value of the target concentration range or a value lower than the lower limit value (Step S5). When the measured concentration reaches the control switching concentration, the control part 60 starts second control that controls the flow rate of the carrier gas on the basis of the deviation between the measured concentration and the target concentration so as to bring the measured concentration close to the target concentration (Step S6).

Note that during the second control, the control part 60 differentiates the change rate of the flow rate of the carrier gas to be introduced into the tank 10 between when the measured concentration comes into a first state within the target concentration range and when the measured concentration comes into a second state out of the target concentration range. Specifically, when determining that the measured concentration comes into the first state (step S7), the control part 60 performs change rate control so as to prevent the flow rate of the carrier gas from changing, in other words, controls the change rate of the flow rate of the carrier gas to zero (Step S8). On the other hand, when determining that the measured concentration comes into the second state (Step S7), the control part 60 controls the flow rate of the carrier gas to change at a constant change rate (Step S9). Specific control for changing the flow rate of the carrier gas at a constant change rate is to change the opening level of the valve 21*b* of the carrier gas flow rate adjustment part 21 and the opening level of the valve 41*b* of the diluent gas flow rate adjustment part 41 respectively by changing corresponding voltages, thereby adjust the flow rates, and change the voltages at regular intervals. The control part 60 switches the control on the basis of whether or not the deviation between the measured concentration and the target concentration is within the target concentration range, i.e., in other words, the control part 60 performs the control on the basis of the deviation.

Next, after a predetermined lead-out time has passed since the start of introduction of the carrier gas into the tank 10, in other words, since the start of leading-out of the material gas from the tank 10 (Step S10), the control part 60 stops the introduction of the carrier gas into the tank (Step S11). Subsequently, after a predetermined stop time has passed since the stop of introduction of the carrier gas into the tank 10 (Step S12), the control part 60 again starts to introduce the carrier gas into the tank 10 (Step S2). Then, the control part 60 repeats the lead-out step of leading out the material gas from the tank 10 and the stop step of not leading out the material gas from the tank 10, and thereby introduce a predetermined amount of the material gas into the deposition chamber intermittently (in a pulse-like manner).

Figure 4:
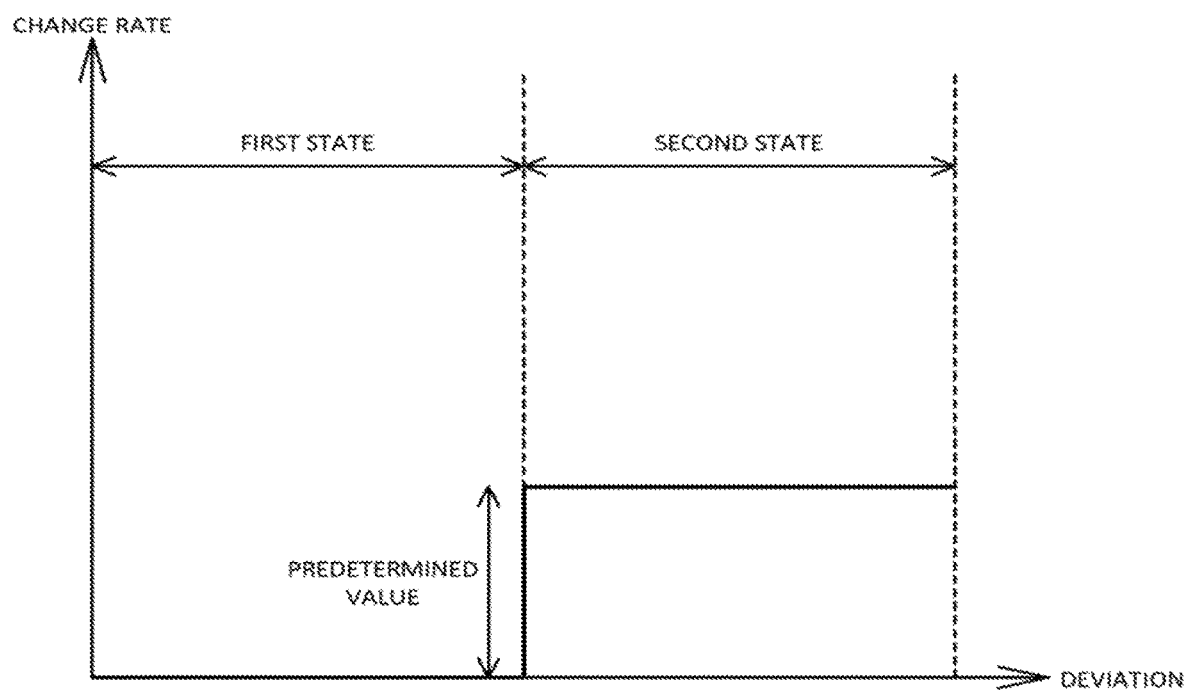
FIG. 4 is a graph illustrating the relationship between the deviation between measured concentration and target concentration and a change rate of the flow rate of carrier gas during second control by the gas control system according to the first embodiment.

In the lead-out step of the gas control system according to the present embodiment, the second control is such that as illustrated in FIG. 4, the change rate of the flow rate of the carrier gas in the first state is set to zero, and the change rate of the flow rate of the carrier gas in the second state is set to be constant. However, it is only necessary to, when switching from the first state to the second state, shift the change rate of the flow rate of the carrier gas to a larger value by a predetermined value, and when switching from the second state to the first state, shift the change rate of the flow rate of the carrier gas to a smaller value by a predetermined value, and it is not necessarily set the change rate in the first state to zero. In addition, the predetermined value when switching from the first state to the second state and the predetermined value when switching from the second state to the first state may be the same or different. Also, switching timing between the first control and the second control is set to timing when the measured concentration reaches the control switching concentration, but may be set to timing after a control switching time has passed since the start of introduction of the carrier gas into the tank. In this case, the control switching timing is required to be set to timing when the measured concentration does not reach the target concentration.

Second Embodiment

Figure 2:
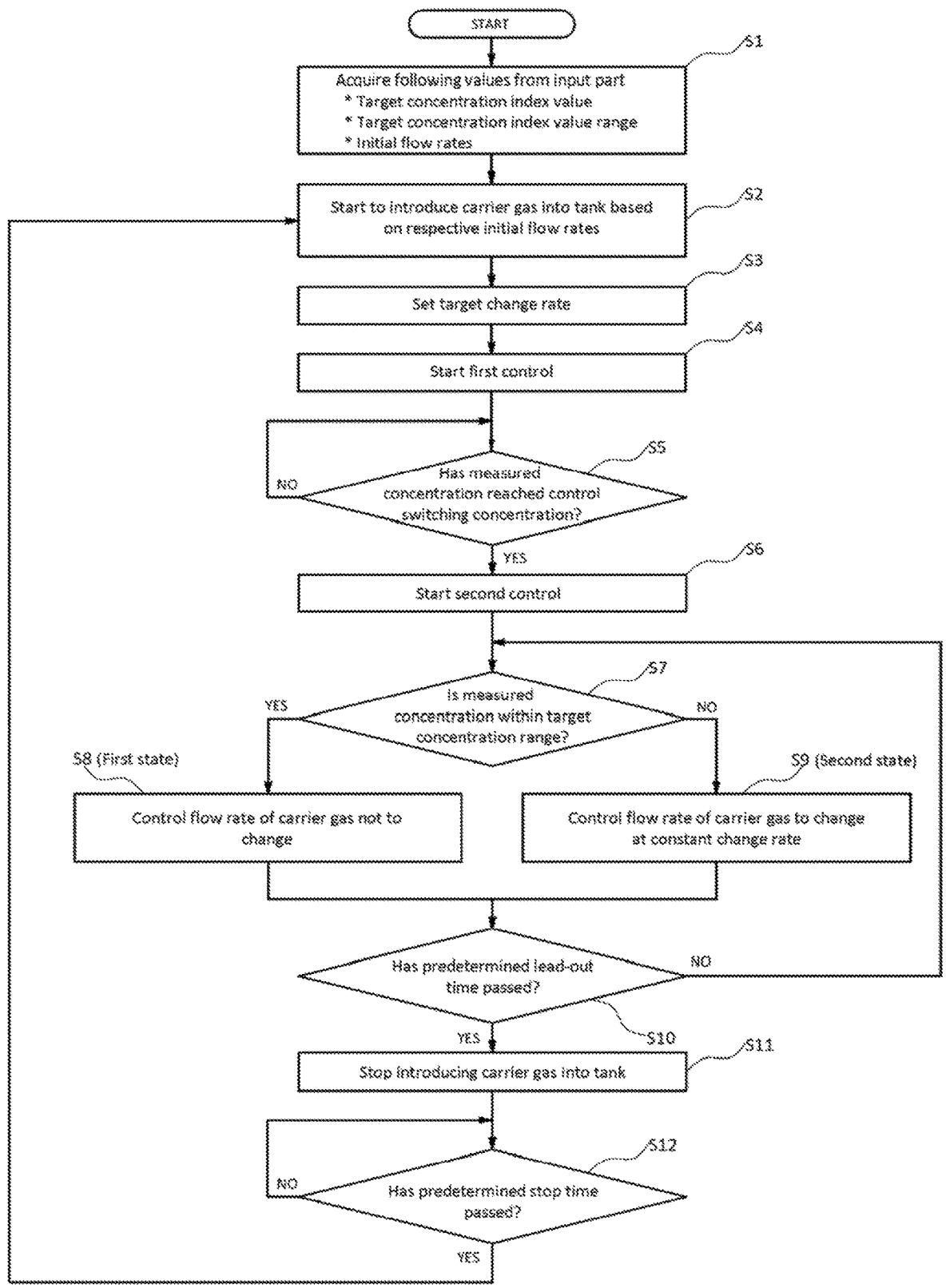
FIG. 2 is a flowchart illustrating an operation procedure for the gas control system according to the first embodiment.
Figure 3:
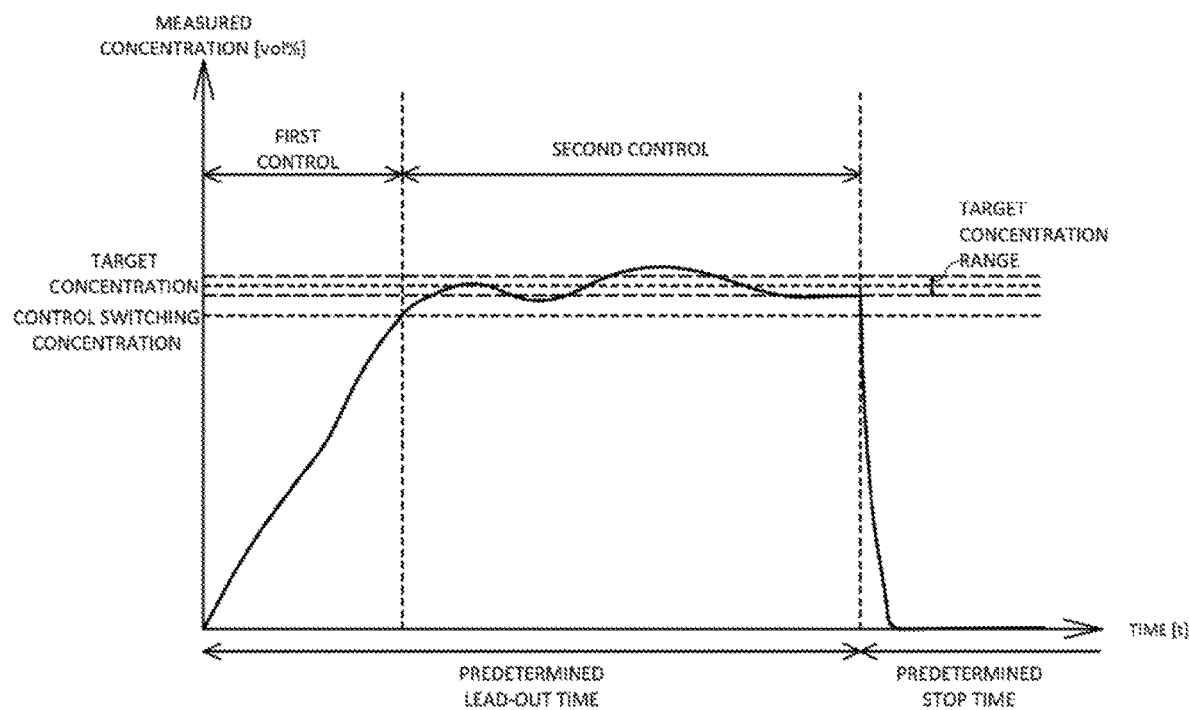
FIG. 3 is a graph illustrating the relationship between measured concentration and time at the time of operation of the gas control system according to the first embodiment.

The present embodiment is a variation of the first control in the first embodiment (in particular, Step S3 in FIG. 2). That is, in the first control of the present embodiment, under different sets of conditions in which material conditions such as the nature and amount of the material, apparatus conditions such as the inside diameter of each pipe member and the capacity of the tank, external conditions such as temperature, and other such conditions are different, the initial change rate of the measured concentration is measured, and the initial change rate is preliminarily stored in an initial change rate data storage part as initial change rate data. Then, the control part sets the predetermined change rate with reference to the initial change rate data stored in the initial change rate data storage part.

Third Embodiment

Figure 5:
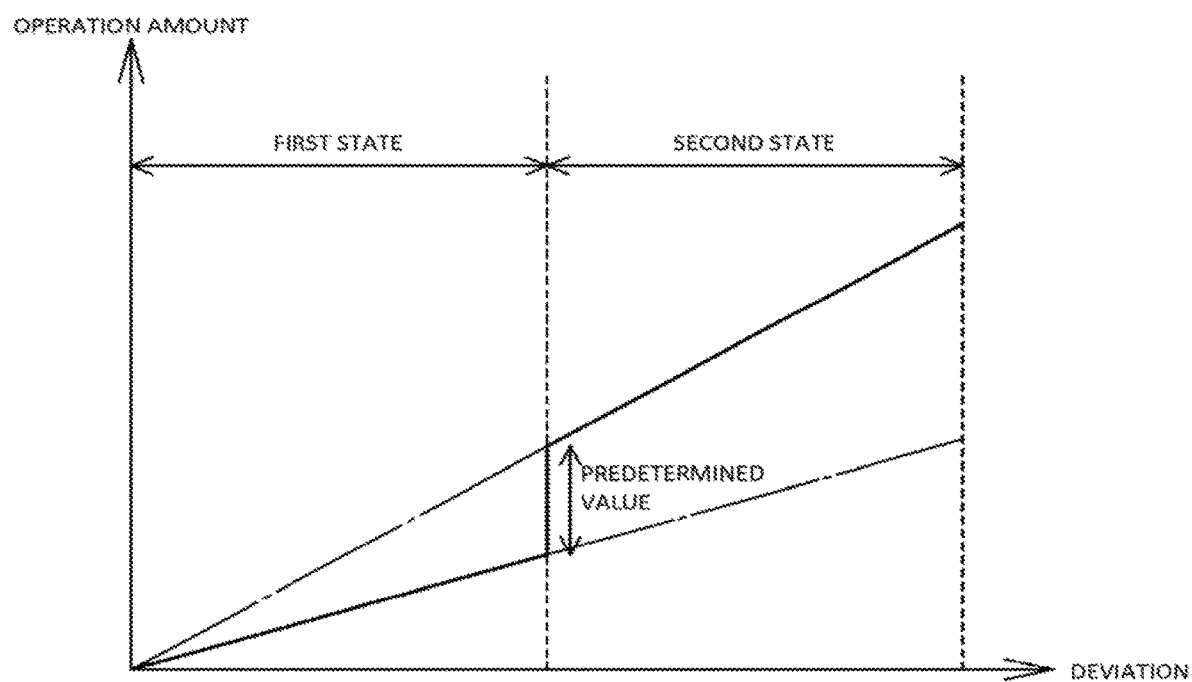
FIG. 5 is a graph illustrating the relationship between the deviation between measured concentration and target concentration and an operation amount of the flow rate of carrier gas during second control by a gas control system according to a third embodiment.

The present embodiment is a variation of the second control in the first embodiment (Steps S6 to S11 in FIG. 2). That is, the second control of the present embodiment is PID control, and when the measured concentration comes into the first state, the proportional gain of the PID control is set to a predetermined value and thereby the PID control is performed so as to prevent the flow rate of the carrier gas from changing. On the other hand, when the measured concentration comes into the second state, the proportional gain of the PID control is set to a larger value than the predetermined value, and thereby the PID control is performed so as to bring the flow rate of the carrier gas close to the target concentration (see FIG. 5).

The present embodiment is adapted to, in the second control, when the measured concentration comes into the first state, set the proportional gain to the predetermined value, but may be adapted to set the predetermined value to zero and thereby prevent the flow rate of the carrier gas from changing.

In addition, in the second control of the first embodiment, control in any one of the first state and the second state may be set as the PID control of the second embodiment. Also, in the second control of the second embodiment, control in any one of the first state and the second state may be set as the control of the first embodiment adapted to set the change rate of the flow rate of the carrier gas to the predetermined value equal to or more than zero.

Further, between the first control and the second control of any of the first to third embodiments, third control that controls the change rate of the flow rate of the carrier gas to zero may be interposed. Such control makes it possible to gradually bring the measured concentration close to the target concentration using the upward tendency of the measured concentration in the first control to thereby reduce overshoot. Also, between the first control and the second control of any of the first to third embodiments, fourth control that performs PID control of the flow rate of the carrier gas on the basis of the deviation between the concentration index value and the target concentration index value is interposed, and in particular, in the fourth control interposed between the first control and the second control of the third embodiment, the proportional gain of the PID control in the second control is set to a lower value than that of the PID control in the fourth control. Such control makes it possible to quickly bring the measured concentration close to the target concentration as well as to reduce overshoot. In addition, when interposing the third control or the fourth control between the first control and the second control, it is only necessary to switch from the third control or the fourth control to the second control when the measured concentration reaches the lower limit value of the target concentration range or comes before that.

In addition, in each of the above-described embodiments, the flow rate of the carrier gas is controlled on the basis of the concentration of the material gas in the mixed gas, but may be adapted to be controlled on the basis of the concentration index value indirectly indicating the concentration of the material gas in the mixed gas. As the concentration index value, the partial pressure of the material gas or the like can be cited.

Other Embodiments

In order to make it easy to control the total amount of the material gas to be led out of the tank, the following control may be performed. For example, when performing PID control of the flow rate of the carrier gas on the basis of the deviation between the target concentration and the measured concentration and thereby controlling the concentration of the material gas in the mixed gas to be led out of the tank, it is also possible not to control the flow rate of the carrier gas on the basis of the deviation between measured concentration measured at predetermined timing and the target concentration but to control the flow rate of the carrier gas on the basis of the deviation between estimated concentration after $\Delta t$, which is estimated from the measured concentration measured at the predetermined timing, and the target concentration.

In this case, the estimated concentration is set with reference to a change in measured concentration measured before the predetermined timing. More specifically, the estimated concentration may be set with reference to the measured concentration measured at the predetermined timing and a change rate among measured concentrations measured during a predetermined time just before the predetermined timing.

In addition, when performing PID control of the flow rate of the carrier gas on the basis of the deviation between the measured concentration and the target concentration and thereby controlling the concentration of the material gas in the mixed gas to be led out of the tank, it is also possible to preliminarily set a controllable range for the operation amount of the flow rate of the carrier gas (an amount corresponding to the change rate of the flow rate of the carrier gas), and when the operation amount of the flow rate of the carrier gas calculated on the basis of the deviation between the measured concentration and the target concentration falls outside the controllable range, control the flow rate of the carrier gas so as to make the operation amount constant at the upper or lower limit value of the controllable range until the operation range falls within the controllable range. Note that the controllable range may be preliminarily set to an arbitrary range, or may be set with reference to an initial change rate in measured concentration measured just after the introduction of the carrier gas into the tank. Further, when the gas control system intermittently supplies a predetermined amount of the material gas as with the above-described embodiments, it is also possible to store a temporal change in measured concentration obtained as a result of performing PID control of the predetermined amount of the material gas led out for the first time in a calibration data storage part as calibration data, and set the controllable range with reference to the calibration data when performing PID control of the predetermined amount of the material gas led out for the second time or thereafter.

Also, when performing PID control of the flow rate of the carrier gas on the basis of the deviation between the measured concentration and the target concentration and thereby controlling the concentration of the material gas in the mixed gas to be led out of the tank, and when the remaining amount of the material in the tank reduces, the concentration of the material gas produced in the tank also reduces, and consequently the control par controls the flow rate of the carrier gas (so as) to relatively increase. Accordingly, the PID control may be performed so as to set the respective gains as the control parameters of the PID control with reference to the relative change in the flow rate of the carrier gas. Further, since the concentration of the material gas produced in the tank is significantly affected by the temperature inside the tank heated by the heater, the PID control may be performed so as to set the respective gains as the control parameters of the PID control with reference to the relative change in the flow rate of the carrier gas and the temperature inside the tank. The control methods described above can be used not only to perform the PID control but also to perform other feedback control of the flow rate of the carrier gas on the basis of the deviation between the measured concentration and the target concentration.

Note that the PID control methods described above can also be employed as the PID control in the second control of any of the first to third embodiments, and even when the PID control methods are employed from control just after the operation of the gas control system, the effects can be obtained.

Further, when performing feedback control of the flow rate of the carrier gas on the basis of the deviation between the measured concentration and the target concentration and thereby controlling the concentration of the material gas in the mixed gas to be led out of the tank, the following control may be performed so as to make the total amount of the material gas led out within a lead-out time from just after starting to introduce the carrier gas into the tank to stopping introducing the carrier gas equal to a target total amount. That is, the control may be performed so as to, from just after starting to introduce the carrier gas into the tank, successively calculate the flow rate of the material gas on the basis of the concentration of the material gas in the mixed gas and the flow rate of the carrier gas, and successively reset the target concentration with reference to a total passing amount that is obtained by adding up the successively calculated flow rates of the material gas and led out of the tank. Also, the control may be performed so as to successively reset the lead-out time with reference to the total passing amount.

LIST OF REFERENCE CHARACTERS

100: Gas control system
10: Tank
20: Carrier gas introduction path
21: Carrier gas flow rate adjustment part
30: Lead-out path
40: Diluent gas introduction path
41: Diluent gas flow rate adjustment part
50: Measurement part
51: Pressure measurement device
52: Partial pressure measurement device
60: Control part

The invention claimed is:

1. A gas control system adapted to introduce carrier gas into a tank containing a material and together with the carrier gas, from the tank, lead out material gas produced by vaporization of the material, the gas control system comprising:
a control part that controls a flow rate of the carrier gas so that a concentration index value obtained by measuring mixed gas led out of the tank and directly or indirectly indicating concentration of the material gas in the mixed gas approaches a predetermined target concentration index value, wherein
the control part performs a first control that controls the flow rate of the carrier gas to change at a constant change rate after introducing the carrier gas into the tank until the concentration index value reaches a control switching concentration index value that is lower than the predetermined target concentration index value, and after the concentration index value becomes the control switching concentration index value, the control part performs a second control that controls the flow rate of the carrier gas on a basis of a deviation between the concentration index value and the target concentration index value.

2. The gas control system according to claim 1, wherein the control part switches to the second control before the concentration index value reaches the target concentration index value.

3. The gas control system according to claim 1, wherein in the first control, the control part sets the constant change rate with reference to an initial change rate of the concentration index value of the mixed gas led out of the tank just after starting to introduce the carrier gas.

4. The gas control system according to claim 1, further comprising:
an initial change rate data storage part that preliminarily stores initial change rate data obtained by measuring the initial change rate under various conditions, wherein
in the first control, the control part sets the constant change rate with reference to the initial change rate data.

5. The gas control system according to claim 1, wherein
in the second control, the control part shifts a change rate of the flow rate of the carrier gas by a predetermined value when the concentration index value switches from any one of a first state of being within a predetermined target concentration index value range including the target concentration index value and a second state of being outside the target index value range to the other.

6. The gas control system according to claim 5, wherein
in the second control, the control part shifts the change rate of the flow rate of the carrier gas so as to increase the change rate by the predetermined value when switching from the first state to the second state, and when switching from the second state to the first state, shifts the change rate of the flow rate of the carrier gas so as to decrease the change rate by the predetermined value.

7. The gas control system according to claim 6, wherein
in any one or both of the first state and the second state of the second control, the control part controls the flow rate of the carrier gas so as to change the flow rate at the constant change rate.

8. The gas control system according to claim 6, wherein
the second control is PID control, and
in the PID control as the second control, the control part sets a proportional gain to a larger value in the second state than in the first state.

9. The gas control system according to claim 6, wherein
in the second control, the control part controls the change rate of the flow rate of the carrier gas in the first state to zero.

10. The gas control system according to claim 1, wherein
between the first control and the second control, the control part performs a third control that controls a change rate of the flow rate of the carrier gas to zero.

11. The gas control system according to claim 1, wherein
between the first control and the second control, the control part performs a fourth control that performs PID control of the flow rate of the carrier gas on the basis of the deviation between the concentration index value and the target concentration index value.

12. The gas control system according to claim 11, wherein
the control part sets a proportional gain of PID control as the second control to a smaller value than the PID control as the fourth control.

13. The gas control system according to claim 1, wherein
the mixed gas is gas produced by further adding diluent gas to the material and carrier gases led out of the tank, and
the control part controls the flow rate of the carrier gas and a flow rate of the diluent gas so that a total amount of the carrier gas and the diluent gas in the mixed gas is kept constant.

14. A deposition apparatus that supplies mixed gas to a deposition chamber through the gas control system according to claim 1.

15. A gas control system adapted to introduce carrier gas into a tank containing a material, and by together with the carrier gas, from the tank, leading out material gas produced by vaporization of the material, intermittently lead out a predetermined amount of the material gas from the tank, the gas control system comprising:
a control part that performs PID control of a flow rate of the carrier gas so that a concentration index value obtained by measuring mixed gas led out of the tank and directly or indirectly indicating concentration of the material gas in the mixed gas approaches a predetermined target concentration index value; and
a calibration data storage part that as calibration data, stores a temporal change in the concentration index value obtained by PID control performed by the control part on the predetermined amount of the material gas led out of the tank for a first time, wherein
when performing the PID control of the predetermined amount of the material gas led out of the tank for a second time or thereafter, the control part refers to the calibration data to set a controllable range that defines upper and lower limits of an operation amount of the flow rate of the carrier gas, the flow rate being determined on a basis of a deviation between the concentration index value and the target concentration index value in the PID control.

16. A gas control system adapted to introduce carrier gas into a tank containing a material and together with the carrier gas, from the tank, lead out material gas produced by vaporization of the material, the gas control system comprising:
a control part that performs feedback control of a flow rate of the carrier gas on a basis of a deviation between a concentration index value obtained by measuring mixed gas led out of the tank and directly or indirectly indicating concentration of the material gas in the mixed gas and a predetermined target concentration index value so that the concentration index value approaches the target concentration index value, wherein
the control part controls a total amount of the material gas led out within a lead-out time from just after starting to introduce the carrier gas into the tank to stopping introducing the carrier gas to a predetermined target total amount.

17. The gas control system according to claim 16, wherein
the control part successively calculates a flow rate of the material gas on a basis of the concentration of the material gas in the mixed gas and the flow rate of the carrier gas from just after starting to introducing the carrier gas into the tank, and successively resets the lead-out time with reference to a total passing amount of the material gas that is obtained by adding up the successively calculated flow rates of the material gas and led out of the tank.

18. A storage medium that stores a program used for a gas control system adapted to introduce carrier gas into a tank containing a material and together with the carrier gas, from the tank, lead out material gas produced by vaporization of the material, the program instructing a computer to fulfil functions of:
controlling a flow rate of the carrier gas so that a concentration index value obtained by measuring mixed gas led out of the tank and directly or indirectly indicating concentration of the material gas in the mixed gas approaches a predetermined target concentration index value; and performing a first control that controls the flow rate of the carrier gas to change at a constant change rate after introducing the carrier gas into the tank until the concentration index value reaches a control switching concentration index value that is lower than the predetermined target concentration index value, and after the concentration index value becomes the control switching concentration index value, performing a second control that controls the flow rate of the carrier gas on a basis of a deviation between the concentration index value and the target concentration index value.

19. A gas control method that controls concentration of material gas in mixed gas to be led out of a tank in a gas control system adapted to introduce carrier gas into the tank containing a material and together with the carrier gas, from the tank, lead out material gas produced by vaporization of the material, the gas control method controlling a flow rate of the carrier gas so that a concentration index value obtained by measuring the mixed gas led out of the tank and directly or indirectly indicating concentration of the material gas in the mixed gas approaches a predetermined target concentration index value; and performing a first control that controls the flow rate of the carrier gas to change at a constant change rate after introducing the carrier gas into the tank until the concentration index value reaches a control switching concentration index value that is lower than the predetermined target concentration index value, and after the concentration index value becomes the control switching concentration index value, performing a second control that controls the flow rate of the carrier gas on a basis of a deviation between the concentration index value and the target concentration index value.

\* \* \* \* \*